United States Patent
Hsieh

(10) Patent No.: US 12,034,103 B2
(45) Date of Patent: Jul. 9, 2024

(54) LIGHT EMITTING DIODE STRUCTURE AND BACKLIGHT MODULE

(71) Applicant: AU Optronics Corporation, Hsin-Chu (TW)

(72) Inventor: I-Hsun Hsieh, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 18/328,112

(22) Filed: Jun. 2, 2023

(65) Prior Publication Data

US 2023/0307596 A1   Sep. 28, 2023

Related U.S. Application Data

(63) Continuation of application No. 17/469,933, filed on Sep. 9, 2021, now abandoned.

(51) Int. Cl.
| | |
|---|---|
| H01L 33/60 | (2010.01) |
| G02F 1/13357 | (2006.01) |
| H01L 33/50 | (2010.01) |
| H01L 33/62 | (2010.01) |

(52) U.S. Cl.
CPC ........ H01L 33/60 (2013.01); G02F 1/133603 (2013.01); G02F 1/133611 (2013.01); H01L 33/50 (2013.01); H01L 33/62 (2013.01); H01L 2933/0041 (2013.01); H01L 2933/0058 (2013.01); H01L 2933/0066 (2013.01)

(58) Field of Classification Search
CPC ............ G02F 1/133605; H01L 33/60
See application file for complete search history.

(56) References Cited

U.S. PATENT DOCUMENTS

| | | | | |
|---|---|---|---|---|
| 8,251,550 B2* | 8/2012 | Lai | .......... | F21S 8/086 |
| | | | | 362/153.1 |
| 10,873,014 B2* | 12/2020 | Hsieh | ...... | H01L 33/60 |
| 11,054,694 B2* | 7/2021 | Park | ......... | F21V 5/04 |
| 11,466,840 B2* | 10/2022 | Hasegawa | ............ | F21V 14/003 |
| 2006/0171151 A1 | 8/2006 | Park | | |

(Continued)

FOREIGN PATENT DOCUMENTS

| | | |
|---|---|---|
| CN | 109390456 A | 2/2019 |
| CN | 109946882 A | 6/2019 |

(Continued)

*Primary Examiner* — Andrew J Coughlin
(74) *Attorney, Agent, or Firm* — WPAT, P.C

(57) ABSTRACT

A light emitting diode structure includes a substrate, a chip on a top surface of the substrate, transparent cup walls on the top surface of the substrate and surround the chip, a wavelength conversion layer covering the chip between the transparent cup walls, and a reflective layer on the wavelength conversion layer. The reflective layer includes a curved bottom surface protruding toward the chip and directly contacting a top surface of the wavelength conversion layer. An edge of the reflective layer directly contacts the transparent cup walls and the wavelength conversion layer. The wavelength conversion layer fills a space defined by the substrate, the transparent cup walls and the reflective layer such that a bottom surface, a side surface, and the top surface of the wavelength conversion layer directly contacts the substrate, the transparent cup walls, and the reflective layer, respectively.

19 Claims, 6 Drawing Sheets

(56) References Cited

U.S. PATENT DOCUMENTS

| | | | |
|---|---|---|---|
| 2006/0208269 A1* | 9/2006 | Kim | H01L 33/54 |
| | | | 257/E33.059 |
| 2007/0086211 A1* | 4/2007 | Beeson | H01L 33/60 |
| | | | 362/616 |
| 2008/0128725 A1 | 6/2008 | Hsing Chen | |
| 2008/0310158 A1* | 12/2008 | Harbers | G02B 6/0078 |
| | | | 362/240 |
| 2010/0252846 A1 | 10/2010 | Bierhuizen et al. | |
| 2012/0162966 A1* | 6/2012 | Kim | G02F 1/133606 |
| | | | 362/97.1 |
| 2012/0188011 A1 | 7/2012 | Retz | |
| 2012/0250350 A1 | 10/2012 | Kim | |
| 2013/0043782 A1 | 2/2013 | Meir et al. | |
| 2013/0328078 A1 | 12/2013 | Wu et al. | |
| 2015/0188011 A1 | 7/2015 | Kang | |
| 2018/0080625 A1 | 3/2018 | Yamada et al. | |
| 2018/0273842 A1 | 9/2018 | Hong et al. | |
| 2019/0006568 A1* | 1/2019 | Hayashi | H01L 33/60 |
| 2019/0044036 A1 | 2/2019 | Pan et al. | |
| 2019/0324327 A1 | 10/2019 | Moon et al. | |
| 2020/0096175 A1 | 3/2020 | Yamada et al. | |
| 2021/0372591 A1 | 12/2021 | Yamada et al. | |

FOREIGN PATENT DOCUMENTS

| | | |
|---|---|---|
| CN | 110398856 A | 11/2019 |
| EP | 3296811 B1 | 12/2019 |
| JP | 2013-115088 A | 6/2013 |
| KR | 10-1575655 B1 | 12/2015 |
| TW | M328081 U | 3/2008 |
| TW | 1336966 B | 2/2011 |

* cited by examiner

LIGHT EMITTING DIODE STRUCTURE AND BACKLIGHT MODULE

CROSS-REFERENCE TO RELATED APPLICATION

This application is a continuation of U.S. application Ser. No. 17/469,933, filed Sep. 9, 2021, which claims priority to Taiwan Application Serial Number 109143106, filed Dec. 7, 2020, all of which are herein incorporated by reference in their entireties.

BACKGROUND

Field of Invention

The present disclosure relates to the backlight module. More particularly, the present disclosure relates to the light emitting diode structure of the backlight module.

Description of Related Art

The liquid crystal display includes the liquid crystal module and the backlight module (or referred as the backlight unit) for providing the light source. According to the positon of the light emitting element in the backlight module corresponds to that of the light emitting surface, the backlight module may be classified as the direct type backlight module and the edge type backlight module. The direct type backlight module may provide the local dimming function so it is broadly used in the liquid crystal display. Therefore, reducing the optical distance of the direct type backlight module to decrease the thickness of the display is critical to the development of the backlight module.

SUMMARY

According to the embodiments of the present disclosure, a light emitting diode structure includes a substrate, and a chip disposed on a top surface of the substrate, in which a bottom surface of the chip directly contacts the top surface of the substrate. The light emitting diode structure includes transparent cup walls disposed on the top surface of the substrate, in which a bottom surface of the transparent cup directly contacts the top surface of the substrate, and the transparent cup walls surround the chip. The light emitting diode structure includes a wavelength conversion layer covering the chip between the transparent cup walls, and a reflective layer disposed on the wavelength conversion layer, in which the reflective layer includes a curved bottom surface protruding toward chip. The curved bottom surface directly contacts a top surface of the wavelength conversion layer, and an edge of the reflective layer directly contacts the transparent cup walls and the wavelength conversion layer. The transparent cup walls continuously surround the wavelength conversion layer and the reflective layer. The wavelength conversion layer fills a space defined by the substrate, the transparent cup walls and the reflective layer such that a bottom surface of the wavelength conversion layer directly contacts the substrate, a side surface of the wavelength conversion layer directly contacts the transparent cup walls, and the top surface of the wavelength conversion layer directly contacts the reflective layer.

In some embodiments, a transmittance of the transparent cup walls is in a range of 20% to 100%.

In some embodiments, an angle between an inner wall of the transparent cup walls and the substrate is in a range of 90° to 170°.

In some embodiments, an outer wall of the transparent cup walls is substantially vertical to the substrate.

In some embodiments, a thickness from the curved bottom surface of the reflective layer to a top surface of the reflective layer is in a range of 30 μm to 100 μm.

In some embodiments, an edge thickness of the reflective layer approaches zero.

In some embodiments, a reflectance of the reflective layer is in a range of 90% to 100%.

In some embodiments, the reflective layer includes a substantially flat top surface.

In some embodiments, a beam angle of the light emitting diode structure is in a range of 95° to 175°.

In some embodiments, the reflective layer comprises silicone.

In some embodiments, a top surface of the reflective layer directly contacts the curved bottom surface of the reflective layer to form the edge of the reflective layer.

According to the embodiments of the present disclosure, a backlight module includes a light emitting diode structure and an optical film disposed over the light emitting diode structure. The light emitting diode structure includes a substrate, and a chip disposed on a top surface of the substrate, in which a bottom surface of the chip directly contacts the top surface of the substrate. The light emitting diode structure includes transparent cup walls disposed on the substrate, in which a bottom surface of the transparent cup directly contacts the top surface of the substrate, and the transparent cup walls surround the chip. The light emitting diode structure includes a wavelength conversion layer covering the chip between the transparent cup walls, and a reflective layer disposed on the wavelength conversion layer, in which the reflective layer includes a curved bottom surface protruding toward the chip. The curved bottom surface directly contacts a top surface of the wavelength conversion layer, and an edge of the reflective layer directly contacts the transparent cup walls and the wavelength conversion layer. The transparent cup walls continuously surround the wavelength conversion layer and the reflective layer. The wavelength conversion layer fills a space defined by the substrate, the transparent cup walls and the reflective layer such that a bottom surface of the wavelength conversion layer directly contacts the substrate, a side surface of the wavelength conversion layer directly contacts the transparent cup walls, and the top surface of the wavelength conversion layer directly contacts the reflective layer.

In some embodiments, the backlight module further includes a wire connecting the chip and the substrate.

In some embodiments, an angle between an inner wall of the transparent cup walls and the substrate is in a range of 90° to 170°.

In some embodiments, the wavelength conversion layer includes a fluorescent material to emit a second light different from a first light emitted by the chip.

In some embodiments, a central thickness from the curved bottom surface of the reflective layer to a top surface of the reflective layer is in a range of 30 μm to 100 μm.

In some embodiments, a beam angle of the light emitting diode structure is in a range of 95° to 175°.

In some embodiments, a top surface of the reflective layer directly contacts the curved bottom surface of the reflective layer to form the edge of the reflective layer.

According to the embodiments of the present disclosure, a light emitting diode structure includes a substrate, and a chip disposed on a top surface of the substrate, in which a bottom surface of the chip directly contacts the top surface of the substrate. The light emitting diode structure includes transparent cup walls disposed on the top surface of the substrate, in which a bottom surface of the transparent cup directly contacts the top surface of the substrate, and the transparent cup walls surround the chip. The light emitting diode structure includes a wavelength conversion layer covering the chip between the transparent cup walls, and a reflective layer disposed on the wavelength conversion layer, in which the reflective layer includes a curved bottom surface protruding toward chip. The curved bottom surface directly contacts a top surface of the wavelength conversion layer, and an edge of the reflective layer directly contacts the transparent cup walls and the wavelength conversion layer. A central thickness from the curved bottom surface of the reflective layer to a top surface of the reflective layer is in a range of 30 μm to 100 μm, and an edge thickness of the reflective layer approaches zero. The transparent cup walls continuously surround the wavelength conversion layer and the reflective layer. The wavelength conversion layer fills a space defined by the substrate, the transparent cup walls and the reflective layer such that a bottom surface of the wavelength conversion layer directly contacts the substrate, a side surface of the wavelength conversion layer directly contacts the transparent cup walls, and the top surface of the wavelength conversion layer directly contacts the reflective layer.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows. Aspects of the present disclosure are best understood from the following detailed description when read with the accompanying figures. It is noted that, in accordance with the standard practice in the industry, various features are not drawn to scale.

DETAILED DESCRIPTION

Figure 1A:
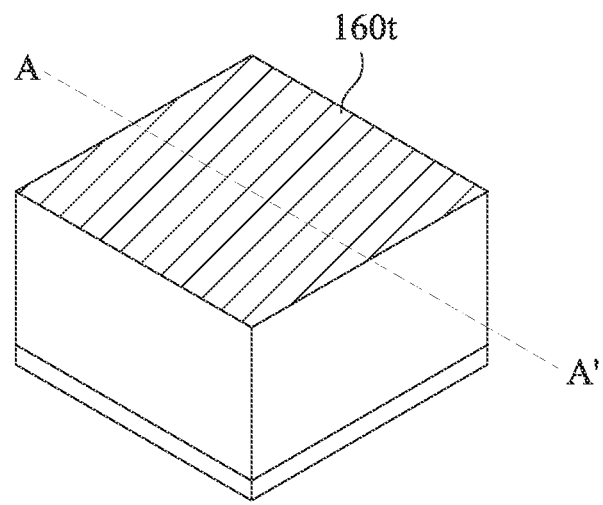
FIG. 1A illustrates a schematic diagram of a light emitting diode according to some embodiments of the present disclosure.

In the figures, the thickness of the layer, the film, the display, or the region is magnified to specifically describe the present disclosure. Through the specification, the same reference numbers are used in the drawings and the description to refer to the same or like parts. The formation of a first feature on or connected to a second feature in the description that follows may include embodiments in which the first and second features are formed in direct contact, and may also include embodiments in which additional features may be formed between the first and second features, such that the first and second features may not be in direct contact. In the contrary, the formation of a first feature directly on or directly connected to a second feature includes embodiments in which the first and second features are formed without another feature between the two features. As used herein, "connection" may be referred as physically and/or electrically connection. In addition, "electrically connected" or "coupled" of two elements may include another element between the two elements.

Further, spatially relative terms, such as "below," "bottom," "above," "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figure is flipped, the element at the lower side of the other(s) may be defined as those at the upper side of the other(s). Therefore, the spatially relative term "below" may include the orientation of "below" and "above."

Additionally, terms, such as "about," "close to," "substantially" and the like, used herein may include the given value and the average of the acceptable deviation of the given value for those skilled in the art. For example, the term "about" may indicate the values in one or more deviation or in ±30%, ±20%, ±10%, or ±5% of the given value.

The present disclosure provides a light emitting diode structure including transparent cup walls and a reflective layer with a curved bottom surface. The transparent cup walls surrounding a chip are disposed on a substrate, and the reflective layer is disposed on a wavelength conversion layer covering the chip. The reflective layer changes the light path emitted by the chip so that the light leaves the light emitting diode from the transparent cup walls on the sides of the light emitting diode. As a result, the luminous intensity above the light emitting diode is decreased and the beam angle range of the light emitting diode is increased.

Figure 1B:
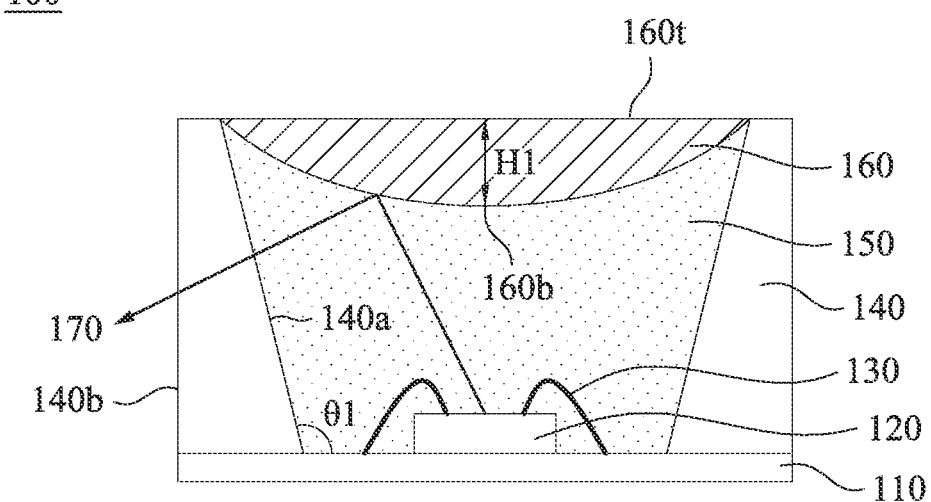
FIG. 1B illustrates a cross-sectional view along the line A-A' of the light emitting diode in FIG. 1A.

According to some embodiments of the present disclosure, FIG. 1A illustrates a schematic diagram of a light emitting diode 100, and FIG. 1B illustrates a cross-sectional view along a line A-A' of the light emitting diode 100 in FIG. 1A. As shown in FIG. 1B, the light emitting diode 100 includes a substrate 110, a chip 120, wires 130, transparent cup walls 140, a wavelength conversion layer 150, and a reflective layer 160. According to some other embodiments of the present disclosure, the light emitting diode 100 may include other layers, materials, or elements, for example, the wavelength conversion layer 150 may specifically be a wavelength conversion layer with double layers.

Figure 1C:
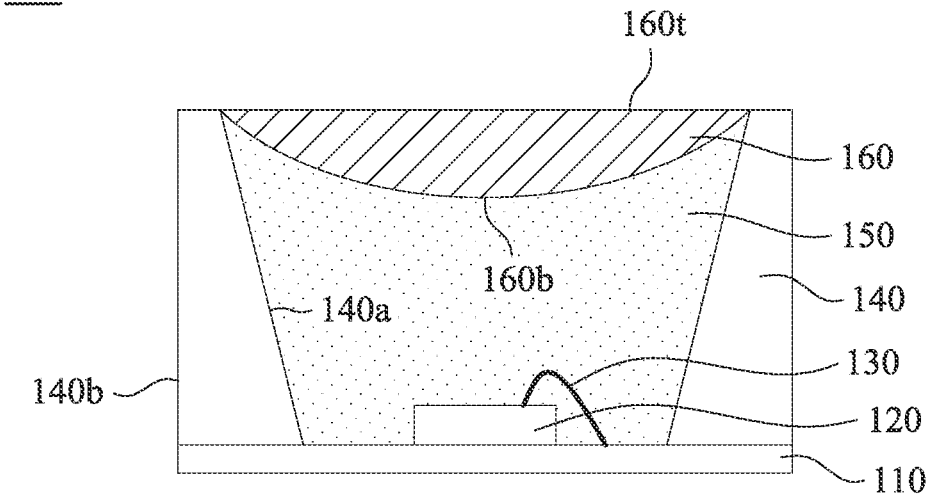
FIGS. 1C-1D illustrate cross-sectional views of light emitting diodes according to some other embodiments of the present disclosure.
Figure 1D:
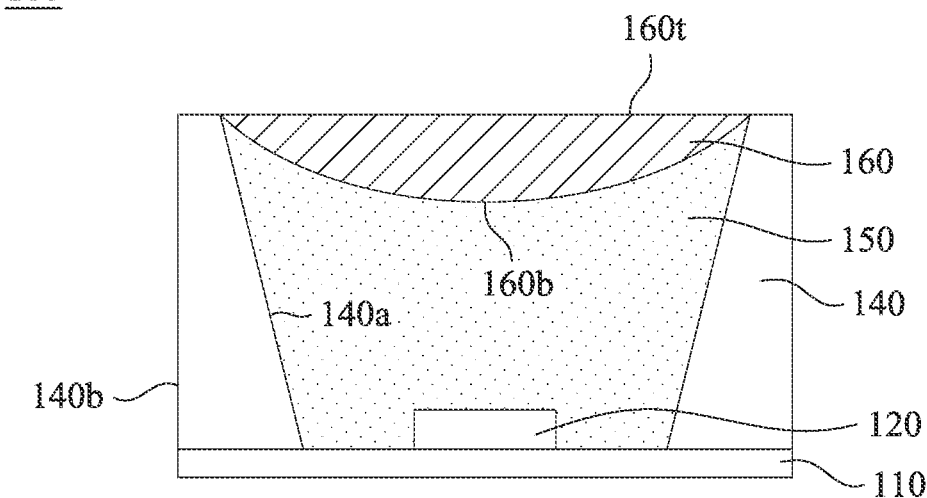

The substrate 110 acts as the carrier of the light emitting diode 100. The substrate 110 may include the insulation material and the wire bracket to provide the current to the light emitting diode 100. In some embodiments, the substrate 110 may be a printed circuit board. The chip 120 is disposed on the substrate 110 as the light source of the light emitting diode 100. The wires 130 connect the chip 120 and the circuit (such as the substrate 110) to provide the current to the chip 120 for light emitting. In some embodiments, the number of the wires 130 may differ because of the type of the chip 120. For example, as shown in FIG. 1B, two wires 130 are connected to the lateral (face-up) chip 120. In contrast, FIGS. 1C-1D illustrate the cross-sectional views of the light emitting diodes 100 according to some other embodiments. The chip 120 in the light emitting diodes 100 may be a vertical chip 120 with one wire 130 as shown in FIG. 1C or a flip chip 120 without wire 130 as shown in FIG. 1D.

The wavelength conversion layer 150 is positioned above the chip 120 and covers the chip 120. The wavelength conversion layer 150 may include the material converting the wavelength of the light from the chip 120. More specifically, after the first light is emitted by the chip 120, the wavelength conversion layer 150 may absorb portions of the first light and emit the second light different from the first light. As a result, the light emitting diode 100 emits a mixed light of the first light and the second light. In other words, the wavelength of the light emitted from the light emitting diode 100 is different from the wavelength of the first light emitted by the chip 120. For example, the wavelength conversion layer 150 may include the fluorescent material so that the wavelength conversion layer 150 may emit the second light with the emission wavelength after absorbing the first light with the excitation wavelength. In the following description, the first light and the second light will be presented as the light 170 to simplify the description.

The reflective layer 160 is disposed on the wavelength conversion layer 150 and above the chip 120, and the reflective layer 160 may reflect the light 170 emitted upward by the chip 120. Since the reflective layer 160 is above the chip 120, the reflective layer 160 reduces the luminous intensity above the light emitting diode 100. In addition, the reflective layer 160 includes a curved bottom surface 160b protruding toward the chip 120, as shown in FIG. 1B. The curved bottom surface 160b may increase the angle range of the light 170 reflected by the reflective layer 160 and leaving the light emitting diode 100. Therefore, the curved bottom surface 160b increases the luminous intensity on the sides of the light emitting diode 100.

In some embodiments, the central thickness of the reflective layer 160 may be larger than the edge thickness along the direction vertical to the flat top surface 160t of the reflective layer 160, which forms the curved bottom surface 160b. For example, as shown in FIG. 1B, the thickness from the central of the bottom surface 160b of the reflective layer 160 to the top surface 160t of the reflective layer 160 may be thickness H1, and the edge thickness of the reflective layer 160 approaches zero. In some embodiments, the thickness H1 may larger than about 30 μm. In some embodiments, the thickness H1 may be in a range of about 30 μm to about 100 μm. However, it should be understood that the thickness H1 may be other values according to the size or the material of the light emitting diode 100.

In some embodiments, the reflective layer 160 may be positioned on the wavelength conversion layer 150, and the edge of the reflective layer 160 may contact the transparent cup walls 140 on the sides of the light emitting diode 100. In other words, the substrate 110, the reflective layer 160, and the transparent cup walls 140 may surround the wavelength conversion layer 150 so that the wavelength conversion layer 150 is free from being exposed to the environment. In such embodiments, the wavelength conversion layer 150 not being exposed may be avoided from the defects caused by the environment (such as the particles, the moisture, or the gas in air). This improves the efficiency and the stability of the light emitting diode 100. For example, the wavelength conversion layer 150 in the package of the reflective layer 160 and the transparent cup wall 140 may be free from being sulfur-corroded which affects the efficiency of the light emitting diode 100.

In some embodiments, the reflectance of the reflective layer 160 may be in a range of about 90% to about 100%. Since the reflective layer 160 has the reflectance to light 170, the light 170 emitted by the chip 120 may be reflected by the reflective layer 160. This decreases the luminous intensity above the light emitting diode 100. Therefore, the reflective layer 160 may include suitable materials with the above mentioned reflectance. In some embodiments, the reflective layer 160 may include silicone.

The transparent cup walls 140 disposed on the substrate 110 and surrounding the chip 120 form the sidewalls of the light emitting diode 100. The light 170 reflected by the reflective layer 160 may leave the light emitting diode 100 through the transparent cup walls 140. The transparent cup walls 140 is positioned around the chip 120 so that the transparent cup walls 140 may increase the luminous intensity on the sides of the light emitting diode 100.

In FIG. 1B, the transparent cup walls 140 include the inner wall 140a and the outer wall 140b. The outer wall 140b of the transparent cup walls 140 may be substantially vertical to the substrate 110, which leads to the column structure of the light emitting diode 100. The angle between the inner wall 140a of the transparent cup walls 140 and the substrate 110 may be angle 61. The angle 61 corresponds to the application of the light emitting diode 100 with different functions, such as the window size of the light emitting diode 100, the position of the light emitting diode 100 and the optical film (not shown) above the light emitting diode 100, the light type of the light emitting diode 100, or the like.

In some embodiments, the angle 61 between the inner wall 140a of the transparent cup walls 140 and the substrate 110 may be in a range of about 90° to about 170°. For example, the light emitting diode 100 may have a rectangular structure, which the angle 61 between the longer inner wall 140a and the substrate 110 is in a range of about 110° to about 170°, and the angle 61 between the shorter inner wall 140a and the substrate 110 is in a range of about 90° to about 150°. However, it should be understood that the angle 61 of other values may be included according to the size or the material of the light emitting diode 100.

In some embodiments, the transmittance of the transparent cup walls 140 may be in a range of about 20% to about 100%. Since the transparent cup walls 140 has the transmittance to light 170, the light 170 emitted by the chip 120 may leave the light emitting diode 100 through the transparent cup walls 140 after being reflected by the reflective layer 160. The transparent cup walls 140 may have different transmittances for the light 170 with different wavelengths. For example, the transmittance of the transparent cup walls 140 to the light 170 with wavelength between 400 nm and 550 nm may be in a range of about 20% to about 50%, while the transmittance of the transparent cup walls 140 to the light 170 with wavelength between 550 nm and 750 nm may be in a range of about 50% to about 70%.

The transparent cup walls 140 may include the materials with the above mentioned transmittance. In some embodiments, the transparent cup walls 140 may include polyamide, poly(p-phenylene hexamethylenediamine) (PA6T), polyamide 9T (PA9T), polycyclohexane-dimethyl terephthalate (PCT), semi-aromatic polyamide, liquid crystal polymer (LCP), thermosetting epoxy resin, thermosetting silicone, or the like.

The reflective layer 160 reflects the light 170 emitting upward from the chip 120, which decreases the luminous intensity above the light emitting diode 100. Additionally, the light 170 penetrating through the transparent cup walls 140 of the sides of the light emitting diode 100 increases the luminous intensity of the sides of the light emitting diode 100. As a result, the beam angle range of the light emitting diode 100 is increased by the reflective layer 160 and the transparent cup walls 140. In some embodiments, the beam angle of the light emitting diode 100 may be in a range of about 95° to about 175°.

Figure 2A:
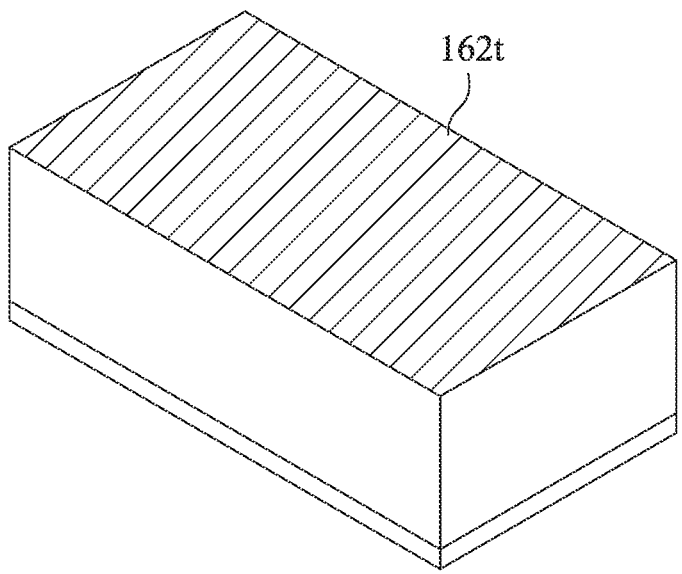
FIGS. 2A-2B illustrate schematic diagrams of the light emitting diode according to some other embodiments of the present disclosure.
Figure 2B:
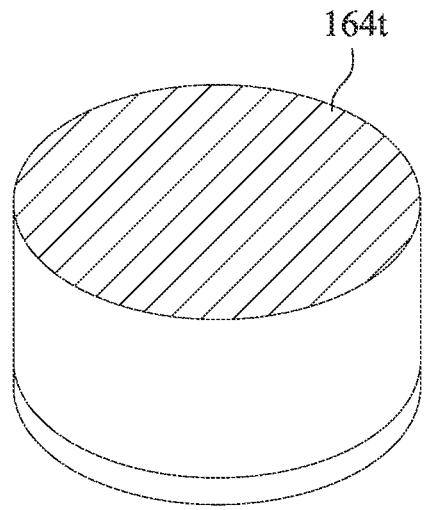

The light emitting diode 100 may have any suitable shape or size to be applied in the design or the process of the light emitting device. According to some other embodiments of the present disclosure, FIG. 2A to FIG. 2B illustrate schematic diagrams of the light emitting diode 102 and the light emitting diode 104, in which the structures of the light emitting diode 102 and the light emitting diode 104 are similar to that of the light emitting diode 100. Referring to FIG. 1A, FIG. 2A, and FIG. 2B, the light emitting diode 100 is rectangular with a square top surface 160t, in which the side length of the top surface 160t may be in a range of about 0.1 mm to about 6.5 mm. The light emitting diode 102 is rectangular with a rectangle top surface 162t, in which the side length of the top surface 162t may be in a range of about 0.1 mm to about 7 mm, and the difference of the two side lengths of top surface 162t may be in a range of about 1 mm to about 5 mm. The light emitting diode 104 is cylinder with a round top surface 164t to provide uniformed light.

Figure 3:
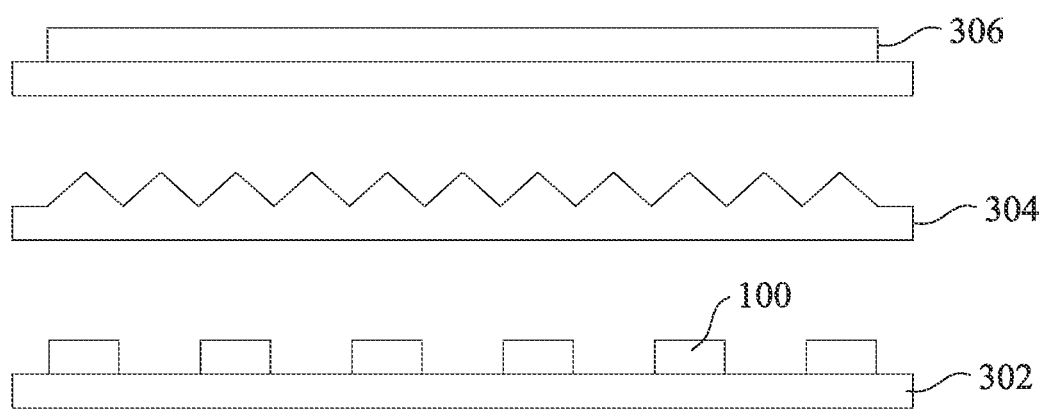
FIG. 3 illustrates an exploded view of a backlight module according to some other embodiments of the present disclosure.

According to some other embodiments of the present disclosure, FIG. 3 illustrates an exploded view of the backlight module 300. The backlight module 300 includes a carrier 302, a light emitting diode 100, an optical film 304, and a liquid crystal display 306. The light emitting diode 100 is disposed on the carrier 302 to act as the light source of the backlight module 300. The optical film 304 is disposed above the light emitting diode 100 to further uniform the light from the light emitting diode 100. The liquid crystal display 306 is disposed above the optical film 304 to receive the light uniformed by the optical film 304. It should be understood that the backlight module 300 as an example is not intended to limit the present disclosure, and the backlight module 300 including other components is in the scope of the present disclosure.

As shown in FIG. 3, the light emitting diode 100 including the reflective layer 160 and the transparent cup walls 140 (such as the light emitting diode 100 in FIG. 1B) may be applied in the backlight module 300. Since the reflective layer 160 and the transparent cup walls 140 of the light emitting diode 100 increases the beam angle range of the light emitting diode 100, the optical distance between the light emitting diode 100 and the optical film 304 is decreased, thereby decreasing the thickness of the backlight module 300. In addition, the light emitting diode 100 with the increased beam angle range increases the light source area of each light emitting diode 100. Therefore, the number of the light emitting diode 100 in the backlight module 300 may be reduced to lower the process cost of the backlight module 300.

According to some embodiments of the present disclosure, FIG. 4 to FIG. 8 illustrate the cross-sectional views of each intermediate stage of the manufacturing process of the light emitting diode 100, in which the cross-sectional is similar to that of FIG. 1B. However, it should be noted that FIG. 4 to FIG. 8 are merely examples and are not intended to limit the present disclosure. Additional steps may be provided before, during, or after the process of FIG. 4 to FIG. 8.

Figure 4:
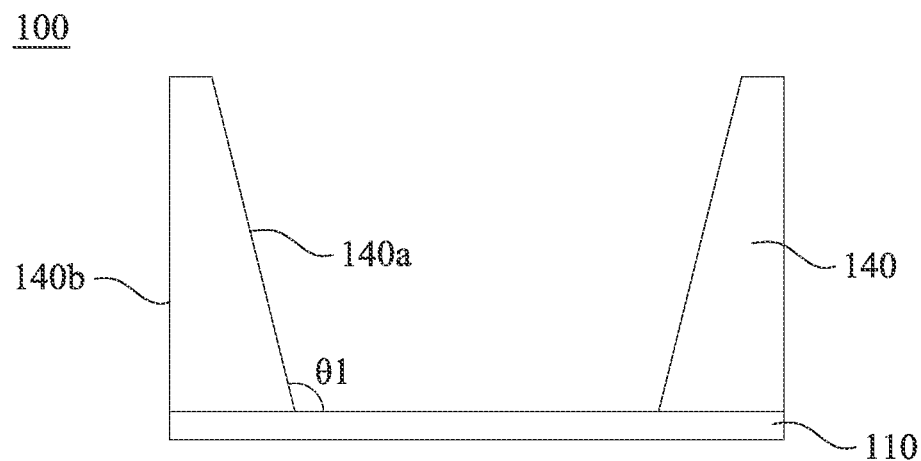
FIGS. 4-8 illustrate cross-sectional views of each intermediate stage of the manufacturing process of the light emitting diode according to some embodiments of the present disclosure.

FIG. 4 illustrates the cross-sectional view of an intermediate stage of the process forming the light emitting diode 100. The transparent cup walls 140 are formed on the substrate 110. Forming the transparent cup walls 140 on the substrate 110 may include forming the outer wall 140b substantially vertical to the substrate 110 and the inner wall 140a with the angle 61 between the inner wall 140a and the substrate 110. As shown in FIG. 4, the transparent cup walls 140 and the substrate 110 form a cup-shaped structure, so that other elements may be disposed in the cup-shaped structure in the following process. In some embodiments, the transparent cup walls 140 may include thermoplastic or thermosetting material, which corresponds to the different processes, such as injection molding or compression molding, forming the transparent cup walls 140.

Figure 5:
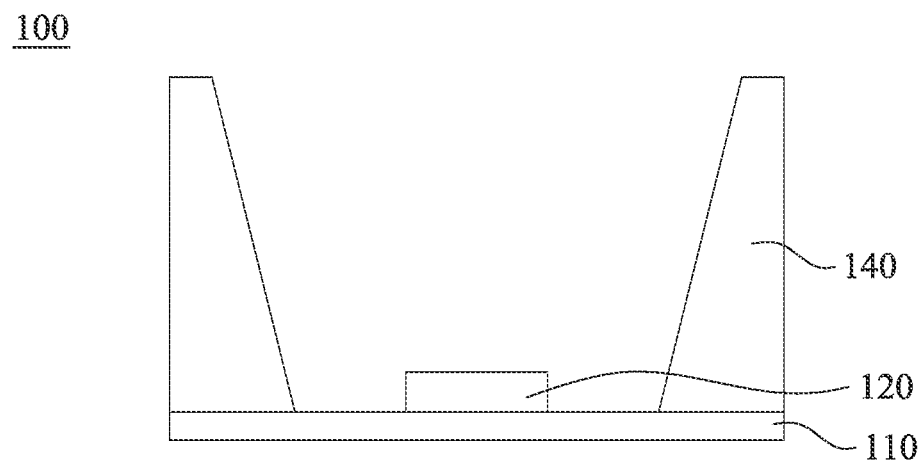

FIG. 5 illustrates the cross-sectional view of an intermediate stage of the process forming the light emitting diode 100. The chip 120 is disposed on the substrate 110 and between the transparent cup walls 140. The chip 120 is disposed on the substrate 110 and connected to the outer source to provide the light source of the light emitting diode 100. In some embodiments, the chip 120 is fixed on the substrate 110 by an adhesion layer.

Figure 6:
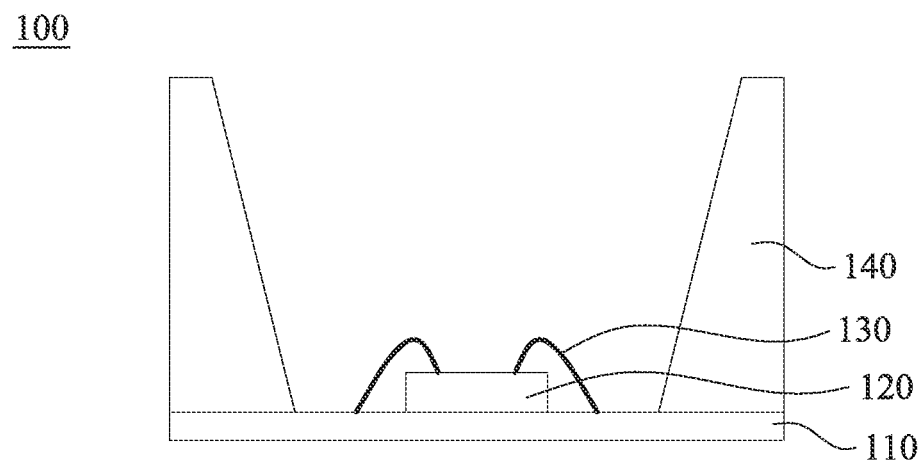

FIG. 6 illustrates the cross-sectional view of an intermediate stage of the process forming the light emitting diode 100. The wires 130 are connected to the chip 120, or the operation may be called "bonding." The wires 130 are connected to the chip 120 and the circuit of the wire bracket on the substrate 110. After the chip 120 and the wires 130 being disposed, the transparent cup walls 140 surround the chip 120. In other words, the chip 120 is disposed in the cup-shaped structure formed by the transparent cup walls 140 and the substrate 110.

Figure 7:
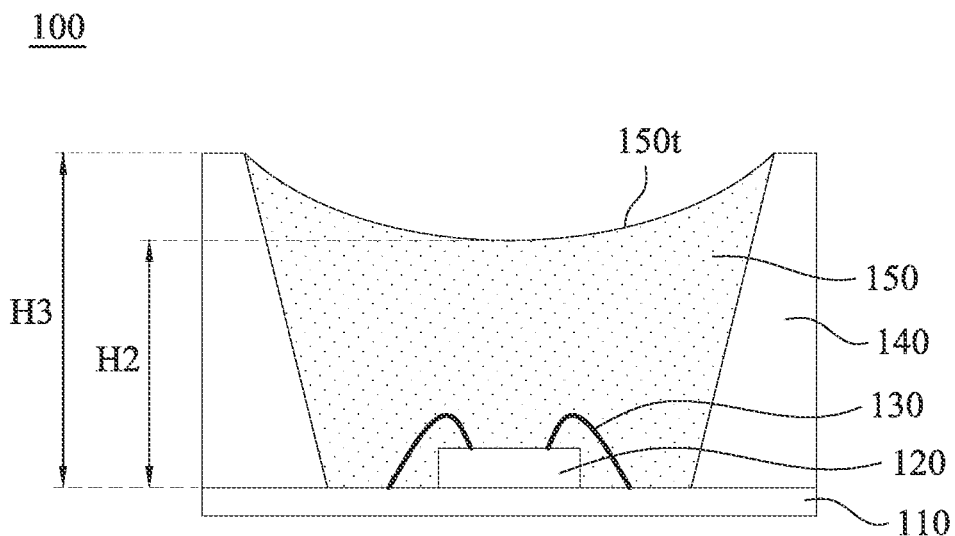

FIG. 7 illustrates the cross-sectional view of an intermediate stage of the process forming the light emitting diode 100. The wavelength conversion layer 150 is formed between the transparent cup walls 140. The wavelength conversion layer 150 is not only formed between the transparent cup walls 140 but also formed above the chip 120 to cover the chip 120. Since the wavelength conversion layer 150 is formed between the transparent cup walls 140 and the wavelength conversion layer 150 covers the chip 120, the wires 130, and the substrate 110, the chip 120 may be avoided from the corrosion caused by the environment. This increases the stability and efficiency of the light emitting diode 100.

In some embodiments, the wavelength conversion layer 150 may include the colloid with cohesion. Therefore, the wavelength conversion layer 150 forming between the transparent cup walls 140 has a top surface 150t recessing toward the chip 120. For example, as shown in FIG. 7, the thickness from the central of the top surface 150t of the wavelength conversion layer 150 to the substrate 110 along the direction vertical to the substrate 110 is thickness H2. The thickness from the edge of the top surface 150t to the substrate 110 is thickness H3, and the thickness H3 is larger than the thickness H2. In some embodiments, the difference between the thickness H2 and the thickness H3 may be larger than about 30 μm. In some embodiments, the difference between the thickness H2 and the thickness H3 may be in a range of about 30 μm to about 100 μm. However, it should be understood that the thickness H2 and the thickness H3 of other values may be included according to the size or the material of the light emitting diode 100.

In some embodiments, forming the wavelength conversion layer 150 may include performing the dispensing process. The material of the wavelength conversion layer 150 is dispensed in the cup-shaped structure formed by the transparent cup walls 140 and the substrate 110. In other words, the transparent cup walls 140 and the substrate 110 define the side boundary and the bottom boundary of the wavelength conversion layer 150 so that the wavelength conversion layer 150 may be avoided from being processed by other cutting process or etching process (such as dry etch or wet etch). Since cutting process or etching process is not performed in the forming process of the wavelength conversion layer 150, the wavelength conversion layer 150 may not be affected by those processes (such as flash and crack caused by cutting process or graphitization and corrosion caused by etching process) which decreases the light emitting efficiency of the wavelength conversion layer 150.

Figure 8:
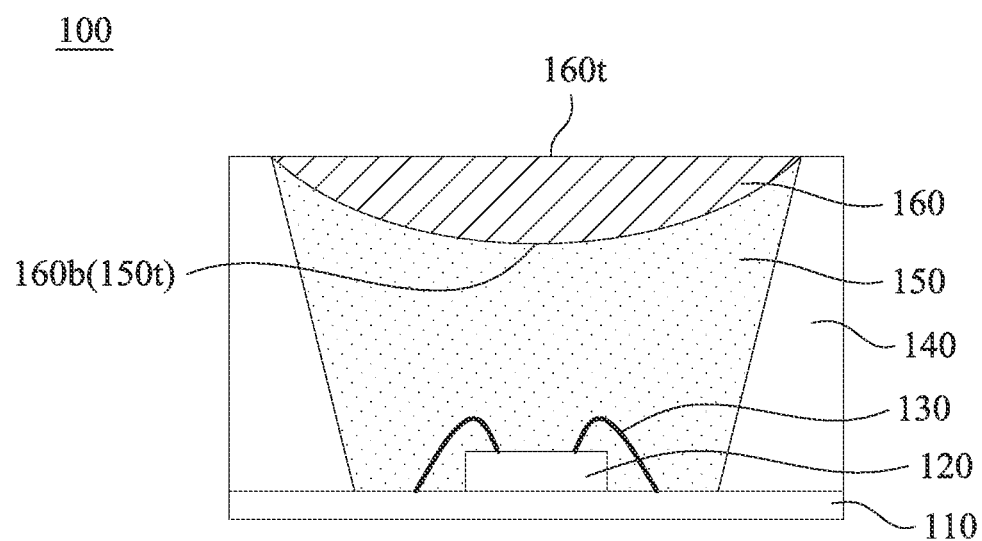

FIG. 8 illustrates the cross-sectional view of an intermediate stage of the process forming the light emitting diode 100. The reflective layer 160 is formed on the wavelength conversion layer 150, and the baking process is performed. The reflective layer 160 includes a bottom surface 160*b* attached to the top surface 150*t* of the wavelength conversion layer 150, leading to the curved bottom surface 160*b* protruding toward the chip 120. In some embodiments, the reflective layer 160 may include the substantially flat top surface 160*t* so that other elements may be easily formed on the light emitting diode 100.

In some embodiments, forming the reflective layer 160 may include performing the dispensing process, which the material of the reflective layer 160 is dispensed on the wavelength conversion layer 150. As shown in FIG. 8, the reflective layer 160, the transparent cup walls 140 and the substrate 110 may pack the wavelength conversion layer 150 into the cup-shaped structure of the light emitting diode 100. This avoid the exposure of the wavelength conversion layer 150 to moisture, corrosion, or other environment factors and increases the stability of the light emitting diode 100.

After forming the reflective layer 160, the light emitting diode 100 is baked to cure the light emitting diode 100. In some embodiments, the baking process may include a plurality of heating stages to increase the adhesion between the reflective layer 160 and the wavelength conversion layer 150. This decrease the possibility of the penetration of moisture and air into the light emitting diode 100. For example, the baking process may include three heating stages with gradient temperatures (such as about 80° C. for the first stage, about 100° C. for the second stage, and about 150° C. for the third stage). The first stage with a relative low temperature may reduce the viscosity of the wavelength conversion layer 150 so that the wavelength conversion layer 150 may be dispensed into the gaps in the light emitting diode 100 with less ripple. The second stage with a temperature between that of the first stage and that of the third stage may decrease the stress caused by the rapid heating up to avoid the deformation of the light emitting diode 100. The third stage with a relative high temperature may sufficiently cure the light emitting diode 100 and increases the chemical adhesion between the reflective layer 160 and the wavelength conversion layer 150.

The present disclosure provides the light emitting diode structure including the reflective layer with the curved bottom surface above the light emitting chip to decrease the luminous intensity above the light emitting diode. The light emitting diode structure also includes the transparent cup walls disposed on the sides of the light emitting chip to increase the luminous intensity of the sides of the light emitting diode. The reflective layer and the transparent cup walls increase the beam angle range of the light emitting diode so that the requirement for the optical distance and the number of the light emitting diode may be reduced. This reduces the thickness of the backlight module using the light emitting diode of the present disclosure and increases the application possibility of the light emitting diode.

In the light emitting diode structure forming process provided by the present disclosure, forming the cup-shaped structure with the transparent cup walls and the substrate and forming the wavelength conversion layer in the cup-shaped structure may avoid performing cutting process or etching process to the wavelength conversion layer. This process design is free from the defects caused by cutting and etching process and thereby improving the yield of the light emitting diode and decreasing the process cost.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A light emitting diode structure, comprising:
   a substrate;
   a chip disposed on a top surface of the substrate, wherein a bottom surface of the chip directly contacts the top surface of the substrate;
   transparent cup walls disposed on the top surface of the substrate, wherein a bottom surface of the transparent cup directly contacts the top surface of the substrate, and the transparent cup walls surround the chip;
   a wavelength conversion layer covering the chip between the transparent cup walls; and
   a reflective layer disposed on the wavelength conversion layer;
   wherein the reflective layer comprises a curved bottom surface protruding toward the chip, the curved bottom surface directly contacts a top surface of the wavelength conversion layer, and an edge of the reflective layer directly contacts the transparent cup walls and the wavelength conversion layer;
   wherein the transparent cup walls continuously surround the wavelength conversion layer and the reflective layer; and
   wherein the wavelength conversion layer fills a space defined by the substrate, the transparent cup walls and the reflective layer such that a bottom surface of the wavelength conversion layer directly contacts the substrate, a side surface of the wavelength conversion layer directly contacts the transparent cup walls, and the top surface of the wavelength conversion layer directly contacts the reflective layer.

2. The light emitting diode structure of claim 1, wherein a transmittance of the transparent cup walls is in a range of 20% to 100%.

3. The light emitting diode structure of claim 1, wherein an angle between an inner wall of the transparent cup walls and the substrate is in a range of 90° to 170°.

4. The light emitting diode structure of claim 1, wherein an outer wall of the transparent cup walls is substantially vertical to the substrate.

5. The light emitting diode structure of claim 1, wherein a thickness from the curved bottom surface of the reflective layer to a top surface of the reflective layer is in a range of 30 μm to 100 μm.

6. The light emitting diode structure of claim 1, wherein an edge thickness of the reflective layer approaches zero.

7. The light emitting diode structure of claim 1, wherein a reflectance of the reflective layer is in a range of 90% to 100%.

8. The light emitting diode structure of claim 1, wherein the reflective layer comprises a substantially flat top surface.

9. The light emitting diode structure of claim 1, wherein a beam angle of the light emitting diode structure is in a range of 95° to 175°.

10. The light emitting diode structure of claim 1, wherein the reflective layer comprises silicone.

11. The light emitting diode structure of claim 1, wherein a top surface of the reflective layer directly contacts the curved bottom surface of the reflective layer to form the edge of the reflective layer.

12. A backlight module, comprising:
a light emitting diode structure, comprising:
a substrate;
a chip disposed on a top surface of the substrate, wherein a bottom surface of the chip directly contacts the top surface of the substrate;
transparent cup walls disposed on the top surface of the substrate, wherein a bottom surface of the transparent cup directly contacts the top surface of the substrate, and the transparent cup walls surround the chip;
a wavelength conversion layer covering the chip between the transparent cup walls; and
a reflective layer disposed on the wavelength conversion layer;
wherein the reflective layer comprises a curved bottom surface protruding toward the chip, the curved bottom surface directly contacts a top surface of the wavelength conversion layer, and an edge of the reflective layer directly contacts the transparent cup walls and the wavelength conversion layer;
wherein the transparent cup walls continuously surround the wavelength conversion layer and the reflective layer; and
wherein the wavelength conversion layer fills a space defined by the substrate, the transparent cup walls and the reflective layer such that a bottom surface of the wavelength conversion layer directly contacts the substrate, a side surface of the wavelength conversion layer directly contacts the transparent cup walls, and the top surface of the wavelength conversion layer directly contacts the reflective layer; and
an optical film disposed over the light emitting diode structure.

13. The backlight module of claim 12, further comprising a wire connecting the chip and the substrate.

14. The backlight module of claim 12, wherein an angle between an inner wall of the transparent cup walls and the substrate is in a range of 90° to 170°.

15. The backlight module of claim 12, wherein the wavelength conversion layer comprises a fluorescent material to emit a second light different from a first light emitted by the chip.

16. The backlight module of claim 12, wherein a central thickness from the curved bottom surface of the reflective layer to a top surface of the reflective layer is in a range of 30 μm to 100 μm.

17. The backlight module of claim 12, wherein a beam angle of the light emitting diode structure is in a range of 95° to 175°.

18. The backlight module of claim 12, wherein a top surface of the reflective layer directly contacts the curved bottom surface of the reflective layer to form the edge of the reflective layer.

19. A light emitting diode structure, comprising:
a substrate;
a chip disposed on a top surface of the substrate, wherein a bottom surface of the chip directly contacts the top surface of the substrate;
transparent cup walls disposed on the top surface of the substrate, wherein a bottom surface of the transparent cup directly contacts the top surface of the substrate, and the transparent cup walls surround the chip;
a wavelength conversion layer covering the chip between the transparent cup walls; and
a reflective layer disposed on the wavelength conversion layer;
wherein the reflective layer comprises a curved bottom surface protruding toward the chip, the curved bottom surface directly contacts a top surface of the wavelength conversion layer, and an edge of the reflective layer directly contacts the transparent cup walls and the wavelength conversion layer;
wherein a central thickness from the curved bottom surface of the reflective layer to a top surface of the reflective layer is in a range of 30 μm to 100 μm, and an edge thickness of the reflective layer approaches zero;
wherein the transparent cup walls continuously surround the wavelength conversion layer and the reflective layer; and
wherein the wavelength conversion layer fills a space defined by the substrate, the transparent cup walls and the reflective layer such that a bottom surface of the wavelength conversion layer directly contacts the substrate, a side surface of the wavelength conversion layer directly contacts the transparent cup walls, and the top surface of the wavelength conversion layer directly contacts the reflective layer.

* * * * *